Figure 1:
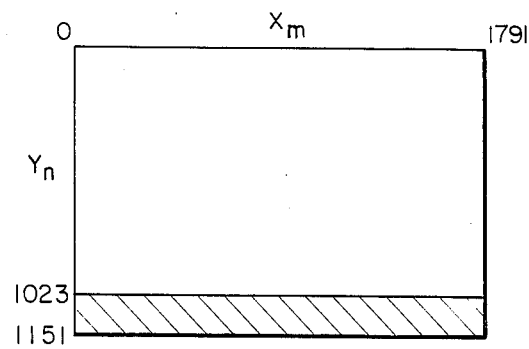

United States Patent [19]
Goldman

[11] Patent Number: 4,758,996
[45] Date of Patent: Jul. 19, 1988

[54] ADDRESS TRANSLATOR

[75] Inventor: Craig E. Goldman, Natick, Mass.

[73] Assignee: Rise Technology, Inc., Everett, Mass.

[21] Appl. No.: 8,848

[22] Filed: Jan. 30, 1987

[51] Int. Cl.$^4$ .............................................. G11C 13/00
[52] U.S. Cl. ..................................... 365/230; 365/189
[58] Field of Search ........................ 365/189, 230, 231

[56] References Cited
U.S. PATENT DOCUMENTS 4,677,594  6/1987  Bisotto et al. ........................ 365/230
4,701,886 10/1987  Sakakibara et al. ................. 365/230

*Primary Examiner*—Terrell W. Fears
*Attorney, Agent, or Firm*—Schiller, Pandiscio & Kusmer

[57] ABSTRACT

A device is disclosed for translating a first address field into a second address field so that data associated with the first address field can be conveniently stored in standard sized memory without the need for expensive hardware normally associated with translation tables and the like. Preferably, the translation can be provided with a simple multiplexor, and where certain conditions exist, the actual memory required to store the data can be reduced.

8 Claims, 1 Drawing Sheet

ADDRESS TRANSLATOR

The present invention relates generally to devices for and methods of more efficiently storing data in a storage memory device and, more particularly, to a device for and method of translating address signals representative of specific locations of a first address map to address signals representative of more efficient locations of a second address map.

Various devices for processing graphic data typically generate signals representative of both the content of each pictorial segment of the original pictorial representation (typically referred to as a "pixel"), and the location of each pixel in the original pictorial representation. Often, the reproduction image of the original pictorial representation is thought of as a matrix array or map of multiple columns and rows of pixels, reproduced, for example, on a predetermined surface in the case of printers or on a screen in the case of cathode ray tube (CRT) monitors. The reproduction image is typically reproduced by scanning the surface or screen with a "writing" instrument such as a laser (in the case of a printer) or an electron gun (in the case of a CRT screen).

In many of the devices for reproducing images, e.g., most printers, the scanning area, upon which the images are provided, is dimensioned so as to accommodate various standard sized paper. For example, one commercially available laser printer has a drum approximately 11 inches long and 17 inches around its circumference so as to accommodate B-sized metric paper having those dimensions. In this type laser printer, where each printed pixel is 1/100 inch by 1/100 inch the printer, by switching the laser on and off as the beam scans the drum, is capable of providing an image approximately as large as 11 by 17 inches by printing the pixel array on a sheet mounted on the drum. The pixel array is shown generally in FIG. 1 as a two-dimensional image having precisely 1152 rows, numbered consecutively from 0 to 1151, and 1792 columns, numbered consecutively from 0 to 1791.

It will be appreciated that the data representative of the information of the image in each pixel is represented in two ways. Specifically, a data signal represents the information contained in the pixel, while an address signal represents the spatial location of the pixel (e.g., by row and column) relative to the other pixels. When it is desirable to store all of the data signals representative of an image, it is necessary to use storage memory comprising a large enough storage capacity to store all of the data signals in a manner so as to preserve the relative spatial relationship among the pixels so that the image can be reproduced. Accordingly, each location in memory, adapted to store a data signal, must be responsive to a corresponding unique address signal so that the data signal associated with that address signal can be read into and written out of that storage location in response to the unique address signal. Thus, in the above example, an image containing a 1152 by 1792 array of pixels is represented by 1152*1792 data signals and 1152*1792 address signals. In order to have a unique address signal for each data signal conventional wisdom has suggested that the digital format of each address signal for a 1152 by 1792 array must contain at least 11 binary bits corresponding to the row location of the pixel (since 10 binary bits can represent the numbers 0 through 1023 and 11 binary bits can represent the numbers 0 through 2047) and at least 11 binary bits corresponding to the column location of the pixel. Thus, in such a conventional approach the address signal should contain 22 binary bits in the address field, which can be represented by:

(1)
$$Y_{10}Y_9Y_8Y_7Y_6Y_5Y_4Y_3Y_2Y_1Y_0X_{10}X_9X_8X_7X_6X_5X_4X_3X_2X_1X_0,$$

wherein the field defined by the bits $Y_{10} \ldots Y_0$ provides a binary number representative of the row location with $Y_{10}$ being the most significant bit and $Y_0$ being the least significant bit, and the field defined by the bits $X_{10} \ldots X_0$ provides a binary number representative of the column location with $X_{10}$ being the most significant bit, and $X_0$ being the least significant bit. Since commercial memory devices typically come in sizes which are powers of 2, given a 22 bit address signal, the smallest amount of conventional storage memory that can be used is $2^{22}$, or 4 megabytes, since it includes $2^{11} \times 2^{11}$ or 2048*2048 (4,194,304) memory locations. It will be apparent, however, that in the example given above, where only 1152*1792 (2,064,384) address locations are needed, excess memory capacity will be provided in 4 megabytes of memory. In fact less than half of the 4 megabyte memory capacity will be utilized. Use of a storage device larger than the capacity actually needed can result in large amounts of unused storage space, greater expense in manufacturing the printing or display instrument, and use of what may be desired space on a logic card of a commercial system.

Where the amount of storage necessary to store all of the data is such that not all of the address signals corresponding to locations of the pixel map directly correspond to address locations of the map of the storage memory, an approach to storing all the data of an image has been to utilize a second storage memory device for storing look up tables for use in translating addresses of the original pixel map into corresponding unique addresses of the map of the storage memory. Thus, in the example where the image contains 1152*1792 pixels it would be possible to store the data in 2 megabytes (2048*1024) of memory, which would cut the required memory in half. The latter memory, however, is responsive to a 21 bit address signal. Accordingly, this approach requires additional memory logic for storing the look up tables for converting each 22 bit address signal to a unique 21 bit address signal before the corresponding data signal can be stored. As such, the use of additional memory logic to store the lookup table does not necessarily result in any substantial savings with respect to the overall expense of manufacturing nor physical space in a commercialized system employing the lookup tables.

Alternatively, another approach has been to generate an address signal having fewer bits, which would be a 21 bit address signal in the example given above, by multiplying the row number by the number of columns and add the column number so as to generate a number corresponding to a unique location in memory. Using a multiplier in the example given, the product of the multiplication will not exceed 1152*1792 (2,064,384), and thus will be within the capacity of the 2 megabytes of memory. Employing a multiplier to generate an address signal however is slow and relatively expensive, or both.

It is therefore an object of the present invention to provide an improved device which reduces or overcomes the disadvantages described above.

Another object of the present invention is to provide a device for use with storage memory for storing data representative of an image in a more efficient manner, without the necessity of additional memory logic, complicated look up tables or signal multipliers.

And another object of the present invention is to provide a device, responsive to at least one bit of the address signal representative of any one of a number of select locations of pixels of a pixel map of an image, for storing data contained in the pixel map in a minimum amount of storage memory, without requiring additional memory logic, complicated look up tables, or signal multipliers.

These and other objects are achieved by an improved device for translating (A) a first address field including a preselected number of bits A representative of a first address map having $X_m$ by $Y_n$ address locations into (B) a second address field including a predetermined number of bits B representative of a second address map having $X_p$ by $Y_q$ address locations, wherein (1) m is an integer varying from 0 to M, (2) n is an integer varying from 0 to N, (3) p is an integer varying from 0 to P, (4) q is an integer varying from 0 to Q, (5) the value of M is equal to a value of $2^a+b$ and the value of N is equal to $2^d+e$, and (6) the value of $P=2^a+b-c=2^g$, and the value of $Q=2^d+e+f=2^h$, (7) a, b, c, d, e, f, g and h are each whole integers, and (8) said first address field includes at least one bit for indicating when said first address field represents addresses of said first address map where m is greater than $2^a+b-c$.

The device comprises:
(a) sensing means for sensing said at least one bit of said first address field representative of addresses of said first address map where m is equal to or greater than $2^a+b-c$; and
(b) means, responsive to said sensing means, for generating the bits of at least a portion of said second address field such that
 (i) when m is less than $2^a+b-c$, said second address field represents the same address locations of said second address map as said first address map; and
 (ii) when m is equal to or greater than $2^a+b-c$, said second address field represents unique address locations of that portion of said second address map where q exceeds $2^d+e$ respectively corresponding to address locations of that porton of said first address map where m equals or exceeds $2^a+b-c$.

In accordance with another aspect of the present invention, the foregoing is achieved by a device for translating a first address signal including a first address field representative of the address locations of a pixel map, into a second address signal including a second address field representative of the address locations of a storage map, wherein the pixel map and address map have corresponding address locations which are in the same relative positions, the pixel map includes address locations which do not directly correspond to locations in the storage map, and the storage map includes address locations which do not directly correspond to locations in the pixel map.

The device comprises:

means for generating the second address signal in response to the first address signal, the means for generating the second address signal including
 (1) means for transmitting the first address signal as the second address signal when the first address field represents one of the address locations which correspond to address locations of the storage map; and
 (2) means for transmitting the second address signal as a modification of the first address signal when the first address field represents address locations of the pixel map which do not correspond to locations in the storage map so as to convert each the first address field to the second address field such that the second address field of each such second signal corresponds to a unique address location of the storage map which does not directly correpond to an address location of the pixel map.

Other objects of the present invention will in part be obvious and will in part appear hereinafter. The invention accordingly comprises the apparatus possessing the construction, combination of elements, and arrangement of parts which are exemplified in the following detailed disclosure, and the scope of the application of which will be indicated in the claims.

Figure 2:
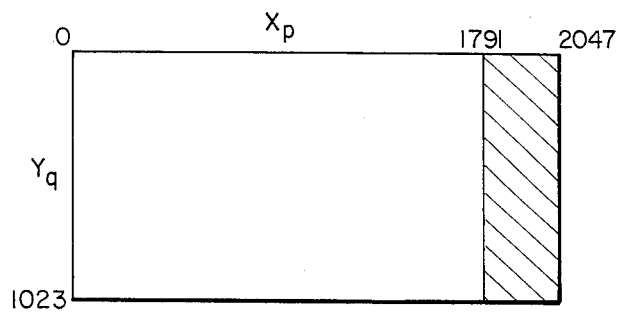
Figure 3:
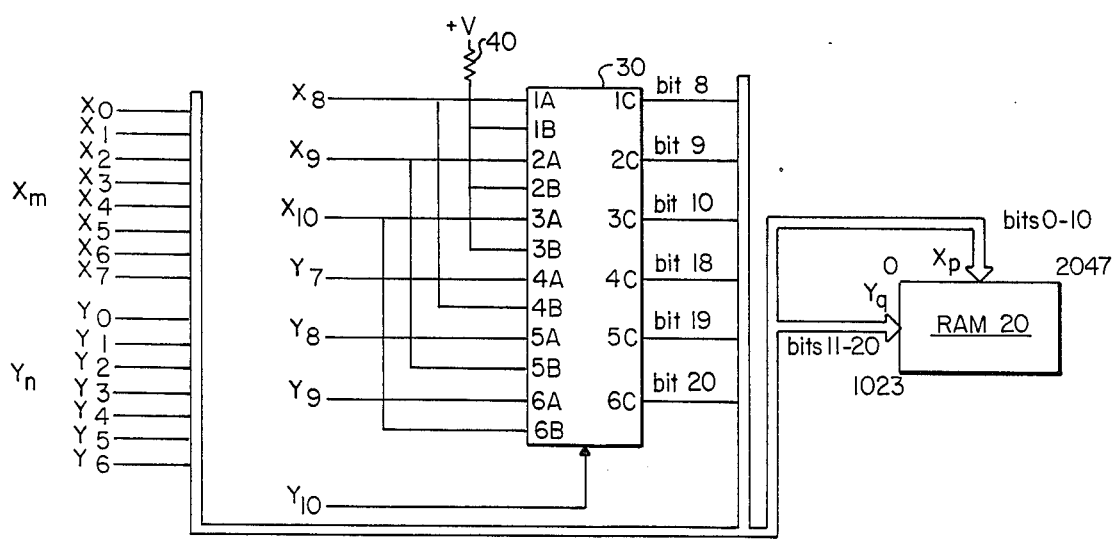

For a fuller understanding of the nature and objects of the present invention, reference should be had to the following detailed description taken in connection with the accompanying drawing wherein:

FIG. 1 is a 2-dimensional representation of the maximum 1792 by 1152 pixel map of an image of the type provided on the largest permissible paper by a laser printer of the type described above;

FIG. 2 is a 2-dimensional representation of a map of a standard two megabytes of memory, drawn to include 2048 unique column addresses and 1024 row addresses, which according to the principles of the present invention provides more efficient use of storage capacity for the addresses corresponding to the 1792 by 1152 pixel map of the image size shown in FIG. 1; and FIG. 3 is the preferred embodiment of the device for translating at least some of the bits of the address signals representative of a pictorial representation provided in the data of the matrix of FIG. 1 for storage in the storage matrix of FIG. 2.

As described above, a maximum-sized image can be printed on paper positioned on the drum of the type of laser printer described above in a by 1792 by 1152 pixel array, (a 2-dimensional map $X_m$ by $Y_n$ of which is shown in FIG. 1) with each array element of the matrix being a pixel of the image. Each pixel can be represented by a data signal containing the informational content represented by each pixel. The exact informational content of each pixel, represented by the corresponding data signal, can vary and is not of importance with respect to an understanding of the present invention.

The relative location of each pixel in the pixel map, shown in FIG. 1, is also represented by an address signal unique to each row and column position so that the image can be easily reconstructed, when printing the image on paper supported by the drum.

It is desirable, therefore, to separately store in memory each data signal of the image formed by the 1792 by 1152 pixel map prior to printing the image so that the pixel information corresponding to each address location of the pixel map can be retrieved from a separate memory location, and subsequently printed in the proper position on a piece of paper mounted on the drum of the printer. The storage capacity of conventional storage memory, however, is only provided in select sizes, typically in powers of 2. The size of the storage memory must be selected so that it is large enough to be responsive to all of the possible address signals corresponding to all of the pixel locations of the pixel map, and therefore capable of storing all of the pixel information. The size of storage memory is therefore dependent on the number of bits of the address field used for the address signal format. For example, a system using a 22 bit address signal is thought to require a minimum of $2^{22}$ bytes, or 4 megabytes, of memory, while a 21 bit address signal is thought to require a minimum of $2^{21}$ bytes, or 2 megabytes of memory. In each the address field includes sufficient bits to provide a binary representation of all of the columns Y plus a binary representation of all of the rows X represented by the address signal.

Thus, a 22 bit address signal appears to be required to represent all 1152 by 1792 address locations, where 11 bits are required to represent all of the 1152 rows (since 10 binary bits only can represent the integers 0 through 1023, while 11 binary bits can represent the integers 0 through 2047) of the pixel map, and similarly 11 bits are required to represent all of the 1792 columns of the pixel map. The memory capacity required to store the data signals corresponding to the 22 bit address signal therefore would be 4 megabytes. While a 22 bit address signal appears to be necessary to represent the addresses of all of the pixels of image, very clearly there are not $2^{22}$ (4 megabytes) of information to be stored. Use of 4 megabytes of storage memory in the example given clearly will provide excess storage. In fact, as described hereinafter, less than half of the 4 megabytes of memory is required to store all the information, indicating that it is possible to represent all of the address locations with a 21 bit address and store all of the information in 2 megabytes of storage. While it is possible to employ lookup tables or multipliers to translate the 22 bit address signal into a 21 bit address signal to address the address locations in 2 megabytes of storage, such devices can be expensive to implement and relatively slow in processing time.

In accordance with the present invention, an improved but simple device is provided, without the need of look up tables, multipliers or other complicated logic, for converting the address signal of a predetermined number of bits, representive of all of the pixel locations of the pixel map, to an address signal compatible with conventionally sized storage memory of the smallest permissible capacity which can be illustrated by the memory map $X_p$ by $Y_q$ shown in FIG. 2. In some instances the capacity of the storage memory required can actually be reduced. In the example given above since the number of data signals to be stored is less than 2 megabytes the minimum memory storage capacity can be reduced in half.

The foregoing is preferably accomplished by using (A) the same address signals representative of the positions of the storage memory map which directly correspond to and represent the same address positions in the pixel map, respectively shown unshaded in FIGS. 1 and 2, and (B) the address signals representative of the locations of the "holes" in the map of storage array (shown shaded in FIG. 2) to store the pixel information at address locations of the pixel map which do not directly correspond to any locations of the storage array (shown shaded in FIG. 1).

In order to determine whether certain addresses of a pixel map can be translated in accordance with the teachings of the present invention, as will be evident hereinafter, the holes located in a particular memory map must be equal to or greater than the number of locations of the pixel map which do not directly correspond to positions in the memory map. Specifically, the maximum number of rows of the pixel map (1152) can be represented by the number $2^a + b$, while the maximum number of columns of the pixel map (1792) can be expressed by the number $2^d + e$, wherein a, b, d and e are whole integers. In the example of FIGS. 1 and 2, a=10 (where $2^{10}$=1024), b=128, d=10 and e=768. The maximum number of rows of the memory map (1024) can be represented by $2^g$, which equals $2^a + b - c$, where g=10, a=10, b=128 and c=128. The maximum number of columns of the memory map (2048) can be represented by 2, which equals $2^d + e + f$, where h=11, d=10, e=768 and f=256. Very clearly, the addition of 1024*256 (264,444) locations (of holes) provided by the additional columns of the memory map (shown shaded in FIG. 2) exceeds the additional 128*1792 (229,376) locations provided by the additional rows of the pixel map (shown shaded in FIG. 1).

The fact that the memory map of FIG. 2 (as chosen) is provided with more columns and fewer rows than that of the pixel map (instead of fewer columns and more rows) has to do with the nature of the state of the bits in the address field of the address signal representative of all of the locations of the pixel map. Specifically, the most significant bit of the X field will be a binary 1 when the column number equals or exceeds 1023 and similarly the most significant bit of the Y field will be a binary 1 when the row number equals or exceeds 1023. Accordingly, therefore, when the most significant bit in the Y field is a binary 1, the address will necessarily have to correspond to the shaded area of FIG. 1.

According to the present invention, the bit(s) in the address field which are in a binary 1 state when designating all of the pixel positions of the pixel map not having direct corresponding positions in storage map chosen, are used to indicate that fact, and for the purposes herein, can be termed the "switching" bit(s). Whether the highest order bit(s) of the address field representative of the rows of the pixel map or the highest order bit(s) of the address field representative of the columns of the pixel map are chosen as the switching bit(s) is dependent upon which field has a greater potential for missing terms (i.e., bits which are always in a binary zero state) when the corresponding switching bit(s) are in binary 1 state.

The foregoing will be clearer from the example provided by FIGS. 1 and 2. Specifically, where the value of $X_m$ varies from 0 to 1791 and $Y_n$ varies from 0 to 1151, the maximum values of $X_m$ and $Y_n$ can be represented in binary form as follows:

$$\text{Max } X_M = 1791 = 2^{10} + 2^9 + 2^8 - 1; \text{ or } = 2^{10} + 2^9 + 2^7 + 2^6 + 2^5 + 2^4 + 2^3 + 2^2 + 2^1 + 2^0; \quad (2)$$

and $$\text{Max } Y_N = 1151 = 2^{10} + 2^7 - 1; \text{ or } = 2^{10} + 2^6 + \quad (3)$$

-continued
$$2^5 + 2^4 + 2^3 + 2^2 + 2^1 + 2^0.$$

In the example, therefore, while the values of X and Y vary depending upon the particular address location, the values of the $X_8$ bit will always be zero when the values of the $X_{10}$ and $X_9$ bits are 1, and the values of the $Y_9$, $Y_8$ and $Y_7$ bits will always be zero when the $Y_{10}$ bit is 1.

Thus, the 11 bits of the 22 bit address signal corresponding to $Y_{10} \ldots Y_0$ field has three bits or "terms" which are "missing", i.e., always zero, when the $Y_{10}$ bit is 1 (the value of Y exceeds 1023), while the 11 bits of the 22 bit address signal corresponding to $X_{10} \ldots X_0$ field has one term which is missing when the $X_{10}$ and $X_9$ bits are 1, with the total number of missing terms of Y (i.e., $2^9$, $2^8$, $2^7 = 3$ terms) being greater than the one missing term of X (i.e., $2^8 = 1$ term). Thus, the portions of the pixel map which are represented by and correspond to those addresses where $Y_{10} = 1$, are mapped into the area of the memory storage map which is not used (i.e., the shaded area). Consequently, when $Y_n$ of FIG. 1 is equal to or greater than 1023, the $Y_{10}$ bit will equal 1. In order to map into the shaded area of FIG. 2 when the $Y_{10}$ bit is a binary 1, the value of $X_p$ of FIG. 2 will necessarily have to exceed 1791, where the $X_{10}$, $X_9$ and $X_8$ bits of the resulting address field of the address signal for the memory map are all binary 1s.

Thus, the address locations of the pixel map where $Y_n$ exceeds 1023 are preferably mapped into the area of the memory map where $X_p$ exceeds 1791, as shown in FIGS. 1 and 2. It will be evident that in mapping the address in this manner the 22 bit signal used to represent the locations in the pixel map of FIG. 1 can be translated to a 21 bit address signal to represent locations in the memory map of FIG. 2.

The actual translation of the 22 bit address to the 21 bit address is accomplished by forcing the bits in the positions of the $X_{10}$, $X_9$ and $X_8$ bits of the 21 bit field to binary 1's (so that $X_p > 1791$), and put the original $X_{10}$, $X_9$ and $X_8$ bits of the 22 bit address of the pixel map in the unused field positions, i.e., $Y_9$, $Y_8$ and $Y_7$ when the switching bit $Y_{10} = 1$. Thus, the 21 bit address field for the storage map of FIG. 2, will be the following bits taken from the 22 bit field when the switching bit $Y_{10}$ of the 22 bit address field for the pixel map = 0:

(4)
$Y_9Y_8Y_7Y_6Y_5Y_4Y_3Y_2Y_1Y_0X_{10}X_9X_8X_7X_6X_5X_4X_3X_2X_1X_0$, and will be the following bits taken from the 22 bit field when the switching bit $Y_{10}$ of the 22 bit address field for the pixel map = 1:

(5)   $X_{10}X_9X_8Y_6Y_5Y_4Y_3Y_2Y_1Y_0$   1   1   1
$X_7X_6X_5X_4X_3X_2X_1X_0$

The foregoing is easily accomplished by the preferred embodiment illustrated in FIG. 3. As shown, the first 11 bits of the input address signal, $X_0 \ldots X_{10}$, represent the position of the column $X_m$, i.e., 0 to 1791, of the pixel map shown in FIG. 1. The second 11 bits of the input address signal, $Y_0 \ldots Y_{10}$, represent the position of the row $Y_n$, i.e., 0 to 1151, of the pixel map shown in FIG. 1. The signal is typically provided over a bus in a manner well known in the art. The total input address signal corresponding to the pixel map $X_m$ by $Y_n$ therefore contains 22 bits. The system shown in FIG. 3 is connected to provide the 21 bit RAM address signal, corresponding to the $X_p$ by $Y_q$ map of FIG. 2, wherein the first 11 bits represent the 2048 rows of $Y_q$ and the last 10 bits represent the 1024 $X_p$ columns.

The bits which correspond to locations in the pixel map of FIG. 1 that also directly correspond to the same relative location in the memory map, i.e., the $Y_0$, $Y_1$, $Y_2$, $Y_3$, $Y_4$, $Y_5$, $Y_6$, $X_0$, $X_1$, $X_2$, $X_3$, $X_4$, $X_5$, $X_6$ and $X_7$, regardless of the state of the switching bit $Y_{10}$ are respectively connected directly to the address input of the storage RAM 20 as the first eight (least significant bits), and the 12th through 18th bits of the RAM address. The multiplexor 30 is connected to provide the remaining 9th through 11th and the 19th through 21st bits of the 21 RAM address signal to the RAM 20 as a function of the state of the switching bit $Y_{10}$.

The multiplexor 30 is shown as a 2 to 1 multiplexor, which, for example, may be a pair of quad 2 to 1 multiplexors designated as 74157 such as those manufactured and sold by Texas Instrument Corporation, of Dallas, Tex., although it should be appreciated that other devices, such as a single Field Programmable Logic Device, can be used. As shown in FIG. 3, since the first 8 bits of the field representative of $X_m$ and the first 7 bits of the field representative of $Y_n$ are the same as the first 8 and 7 bits of the field respectively representative of $X_p$ and $Y_q$, respectively, these signal bits are applied directly to address input of RAM 20 as the 1 through 8 (the first eight least significant bits of $X_p$) and 12 through 18 (the first seven least significant bits of $Y_q$) address inputs.

The inputs for the 8th through 10th bits of the address field ($X_8$, $X_9$ and $X_{10}$) are respectively connected to the 1A, 2A, and 3A inputs of multiplexor 30. The $X_8$, $X_9$ and $X_{10}$ bit inputs are also provided to the respective 4B, 5B and 6B inputs of the multiplexor 30. Inputs 1B, 2B, and 3B are connected through resistor 40 to a voltage source so as to provide a binary logic one signal to those input terminals. The inputs for the 18th through 20th bits of the address field ($Y_7$, $Y_8$, $Y_9$) are connected respectively to the 4A, 5A and 6A input terminals of multiplexor 30. Finally, the 22nd bit of the field, ($Y_{10}$) is provided to the select input of the mu device 30. The 1C, 2C, 3C, 4C, 5C and 6C outputs of the device 30 are connected to the 8th, 9th and 10th, 18th, 19th and 20th inputs (respectively the three most significant bits, the 9th, 10th and 11th bits of the pattern of the address field representative of Xp of the RAM address, and the three most significant bits, the 8th, 9th and 10th bits of the portion of the field representative of Yq of the RAM address) of the RAM 20.

As is well-known in the art, when the select input of multiplexor is a binary 0, the 1A-6A inputs of the device are connected respectively to the 1C-6C outputs of the device, and when the select input of the multiplexer is a binary 1, the 1B-6B inputs of the device are connected respectively to the 1C-6C outputs of the device.

In operation, it will be evident that the device will carry out the conditions described for the two address fields (4) and (5) above, as a function of the state of the switching bit $Y_{10}$. The first eight address bits of $X_p$ are the same as the first eight address bits of $X_m$ and the first seven address bits of $Y_q$ are the same as the first seven address bits of $Y_n$. When the 11th bit of $Y_n$ provided to the select input of the device 30 is a binary zero, the A inputs of the multiplexor are connected to the output of the device so that the 8th, 9th, 10th, 19th, 20th and 21st bits of the address signal applied to the RAM 20 are the $X_8$, $X_9$, $X_{10}$, $Y_7$, $Y_8$ and $Y_9$ bits, respectively, of the pixel map as required by the field (4), above.

If the switching bit Y is a binary one, the input signals at the 1B, 2B and 3B inputs of the multiplexor 30 will be provided through the 1C, 2C and 3C outputs of the device to the 8th, 9th and 10th bit address inputs of the RAM 20, i.e., the 8th, 9th and 10th bits of the address input of RAM 20 are all forced to a binary one. Similarly, the 8th–10th $X_m$ bits will be provided through the multiplexor to the 19th, 20th and 21st bits of the RAM address, all as required by the address field (5) above.

Using this technique, it should be appreciated that the 22 bit $X_m$ by $Y_n$ address is effectively transformed into a 21 RAM address representative of the $2^{11}$ by $2^{10}$, i.e., 2048 by 1024 ($X_p$ by $Y_q$), storage map. The storage capacity required to store the pixel infomation of the map shown in FIG. 1 is therefore reduced from 4 megabytes to 2 megabytes with the use of a simple multiplexor.

The present invention can be easily used with other maps and address fields so long as a sufficient number of holes exists in the map of the storage memory used to store that information corresponding to positions in the pixel map which do not directly correspond to positions in the memory map.

For example, certain graphic devices use an array of 640 by 384 pixels to provide a pixel map. In this instance the pixel map has X values which vary from 0 to 639 and Y values which vary from 0 to 383. The maximum value of X and Y can be represented as follows:

$X_{max} = 639 = 2^9 + 2^7 - 1$; and $Y_{max} = 383 = 2^8 + 2^7 - 1$.

The address locations of the pixel map are therefore represented by a 10 bit number for X and a 9 bit number for Y so as to provide a 19 bit address field.

In this case the $2^8$ and $2^7$ bits of X will always be zero when X equals or exceeds $2^9$, while the $2^7$ bit of Y will always be zero when Y equals or exceeds 2. Accordingly, since $2^8 + 2^7 > 2^7$, and the number of missing bits of X is equal to or greater than the number of missing bits of Y, the present invention can be utilized with the most significant bit of X, i.e., $X_9$, being used as the switching bit. The translated 18 bit address field therefore becomes:

(6) $Y_8Y_7Y_6Y_5Y_4Y_3Y_2Y_1Y_0X_8X_7X_6X_5X_4X_3X_2X_1X_0$, when $X_9$ is zero.

If $X_9$ is one, it is clear that the $X_8$ and $X_7$ bits will always be zero since they contain no needed information to express the numbers between 512 and 639. Accordingly, these numbers will correspond to the position of holes in memory storage and can be used to store data provided from positions not having a direct one to one correspondence. This is accomplished by forcing the bits in the field positions of $Y_8$ and $Y_7$ to binary 1, and transposing the original $Y_8$ and $Y_7$ bits into the original $X_8$ and $X_7$ bit field positions of the address field applied to the RAM when the switching bit $Y_9$ is one. The address field for the 18 bit address therefore becomes:

(7) 1 1 $Y_6Y_5Y_4Y_3Y_2Y_1Y_0Y_8Y_7X_6X_5X_4X_3X_2X_1X_0$, when $X_9$ is one.

Both fields (6) and (7) provide an 18 bit address field from a 19 bit address field. The total hardware requirements to carry out the translation from the 19 bit address to the 18 bit address will be a multiplexor for four 2:1 multiplexed bits, in a manner similar to that shown in FIG. 3.

Another pixel map which is commonly used provides a 1152 by 896 array. In this instance the pixel map has X values which vary from 0 to 1151 and Y values which vary from 0 to 895. The maximum value of X and Y can be represented as follows:

$X_{max} = 1151 = 2^{10} + 2^7 - 1$; and $Y_{max} = 895 = 2^9 + 2^8 + 2^7 - 1$.

The address locations of the pixel map are therefore represented by an 11 bit number for X and a 10 bit number for Y so as to provide a 21 bit address field.

In this case the $2^9$, $2^8$ and $2^7$ bits of X will always be zero when X equals or exceeds $2^{10}$, while the $2^7$ bit of Y will always be zero when Y equals or exceeds $2^9 + 2^8$. Accordingly, since $2^9 + 2^8 + 2^7 > 2^7$, and the number of missing bits of X is equal to or greater than the number of missing bits of Y, the present invention can be utilized with the most significant bit of X, i.e., the $X_{10}$ bit, being used as the switching bit. The translated 20 bit address field therefore becomes:

(8) $Y_9Y_8Y_7Y_6Y_5Y_4Y_3Y_2Y_1Y_0X_9X_8X_7X_6X_5X_4X_3X_2X_1X_0$, when $X_{10}$ is zero.

If $X_{10}$ is one, it is clear that the $X_9$, $X_8$ and $X_7$ bits will always be zero since they contain no needed information to express the numbers between 1024 and 1151. Accordingly, these numbers will correspond to the position of holes in memory storage and can be used to store data provided from positions not having a direct one to one correspondence. This is accomplished by forcing the bits in the field positions of $Y_9$, $Y_8$ and $Y_7$ to binary 1, and transposing the original $Y_9$, $Y_8$ and $Y_7$ bits into the original $X_9$, $X_8$ and $X_7$ bit field positions of the address field applied to the RAM when the switching bit $X_{10}$ is one. The address field for the 20 bit address becomes:

(9) 1 1 1 $Y_6Y_5Y_4Y_3Y_2Y_1Y_0Y_9Y_8Y_7X_6X_5X_4X_3X_2X_1X_0$, when $X_{10}$ is one.

Both fields (8) and (9) provide a 20 bit address field from a 21 bit address field. The total hardware requirements to carry out the translation from the 21 bit address to the 20 bit address will be a multiplexor for six 2:1 multiplexed bits, in a manner similar to that shown in FIG. 3.

It should be appreciated that while the conventional representation of a matrix X by Y refers to X columns and Y rows, it is intended that the present invention as defined by the following claims should not be so limited. As used in the claims, both the letters X and Y, together with their prefixes, can respectively refer to rows and columns or columns and rows, depending on the point of reference.

It will be further appreciated that the invention provides an inexpensive technique of translating address signals for graphic data in a simple, inexpensive way, without resorting to expensive memory devices for storing translation lookup tables. The objects of the invention require a simple device, such as a multiplexor, to minimize the use of logic circuitry. The device further minimizes the amount of memory capacity necessary to store data resulting in the economic use of space on the logic card in the device with which the invention is employed.

Since certain changes may be made in the above apparatus without departing from the scope of the invention herein involved, it is intended that all matter contained in the above description or shown in the accompanying drawing shall be interpreted in an illustrative and not in a limiting sense.

What is claimed is:

1. A device for translating a first address field including a preselected number of bits A representative of a first address map having $X_m$ by $Y_n$ address locations into a second address field including a predetermined number of bits B, representative of a second address map having $X_p$ by $Y_q$ address locations, wherein (1) m is an integer varying from 0 to M, (2) n is an integer varying from 0 to N, (3) p is an integer varying from 0 to P, (4) q is an integer varying from 0 to Q, (5) the value of M is equal to a value of $2^a+b$ and the value of N is equal to $2^d+e$, and (6)$_d$ the value of $P=2^a+b-c=2^g$, and the value of $Q=2^d+e+f=2^h$, (7) a, b, c, d, e, f, g and h are each whole integers, and (8) said first address field includes at least one bit for indicating when said first address field represents addresses of said first address map where m is greater than $2^a+b-c$, said device comprising:
   (a) sensing means for sensing said at least one bit of said first address field representative of addresses of said first address map where m is equal to or greater than $2^a+b-c$; and
   (b) means responsive to said sensing means for generating the bits of at least a portion of said second address field such that
      (i) when m is less than $2^a+b-c$, said second address field represents the same address locations of said second address map as said first address map; and
      (ii) when m is equal to or greater than $2^a+b-c$, said second address field represents unique address locations of that portion of said second address map where q exceeds $2^d+e$ respectively corresponding to address locations of that porton of said first address map where m equals or exceeds $2^a+b-c$.

2. A device according to claim 1, wherein said means for generating said bits of at least a portion of said second address field senses those bits of said first field which are representative of binary zero for all of the address locations of said first address map where m equals or exceeds $2^a+b-c$.

3. A device according to claim 2, wherein said means for generating said bits of at least a portion of said second address field generates the sensed bits of said first field when m is less than $2^a+b-c$.

4. A device according to claim 3, wherein said means for generating said bits of at least a portion of said second address field:
   (a) generates bits in said second address field for forcing one or more of the bits of said second address field to represent a binary one so that the second address field will represent address locations of said second address map where q exceeds $2^d+e$, and
   (b) transposes bits from said first address field in said second address field so that address locations of said first address map where m equals or is greater than $2^a+b-c$ correspond to unique address locations of said second address map, when m is equal to or greater than $2^a+b-c$.

5. A device according to claim 4, wherein said means and said means for sensing and said means for generating said bits includes a multiplexor.

6. A device according to claim 4, wherein the number of bits A of said first address field is greater than the number of bits B of said second address field so that the size of said second address field is reduced from the size of said first address field.

7. A device according to claim 6, wherein said sensing means is responsive to the most significant bit of said first address field representative of that portion m of the address location $X_m$ by $Y_n$.

8. A device for translating a first address signal including a first address field representative of the address locations of a pixel map, into a second address signal including a second address field representative of the address locations of a storage map, wherein said pixel map and address map have corresponding address locations which are in the same relative positions, said pixel map includes address locations which do not directly correspond to locations in the storage map, and said storage map includes address locations which do not directly correspond to locations in the pixel map, said device comprising:
   means for generating said second address signal in response to said first address signal, said means for generating said second address signal including
      (1) means for transmitting said first address signal as said second address signal when said first address field represents one of said address locations which correspond to address locations of said storage map; and
      (2) means for transmitting said second address signal as a modification of said first address signal when said first address field represents address locations of said pixel map which do not correspond to locations in said storage map so as to convert each said first address field to said second address field such that the second address field of each such second signal corresponds to a unique address location of said storage map which does not directly correpond to an address location of said pixel map.

* * * * *

UNITED STATES PATENT AND TRADEMARK OFFICE
CERTIFICATE OF CORRECTION

PATENT NO. : 4,758,996

DATED : July 19, 1988

INVENTOR(S) : Craig E. Goldman

It is certified that error appears in the above-identified patent and that said Letters Patent is hereby corrected as shown below:

Claim 1, column 11, line 29, after (6), delete the subscript "d";

Claim 5, column 12, line 19, delete "and said means" (first occurrence);

Claim 8, column 12, line 59, delete "correpond" and substitute therefor -- correspond --.

Signed and Sealed this

Third Day of January, 1989

Attest:

DONALD J. QUIGG

*Attesting Officer*  *Commissioner of Patents and Trademarks*